US009397242B2

(12) United States Patent
Taniguchi et al.

(10) Patent No.: US 9,397,242 B2
(45) Date of Patent: Jul. 19, 2016

(54) SILICON SUBSTRATE HAVING TEXTURED SURFACE, AND PROCESS FOR PRODUCING SAME

(75) Inventors: Yasushi Taniguchi, Osaka (JP); Shigeru Sankawa, Sr., Osaka (JP); Kouji Arai, Nara (JP); Hiroshi Tanabe, Nara (JP); Ichiro Nakayama, Osaka (JP); Naoshi Yamaguchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 250 days.

(21) Appl. No.: 14/006,357

(22) PCT Filed: Mar. 28, 2012

(86) PCT No.: PCT/JP2012/002156
§ 371 (c)(1),
(2), (4) Date: Sep. 20, 2013

(87) PCT Pub. No.: WO2012/132433
PCT Pub. Date: Oct. 4, 2012

(65) Prior Publication Data
US 2014/0020750 A1    Jan. 23, 2014

(30) Foreign Application Priority Data

Mar. 30, 2011  (JP) ................................. 2011-076145
Feb. 29, 2012  (JP) ................................. 2012-042936

(51) Int. Cl.
*H01L 31/0236*  (2006.01)
*H01L 21/306*   (2006.01)
*H01L 29/04*    (2006.01)

(52) U.S. Cl.
CPC .... *H01L 31/02363* (2013.01); *H01L 21/30604* (2013.01); *H01L 29/045* (2013.01); *Y02E 10/50* (2013.01)

(58) Field of Classification Search
CPC ..................... H01L 21/6708; H01L 31/02363; H01L 21/32137; H01L 31/02245; H01L 31/022458; H01L 31/068; Y02E 10/547
See application file for complete search history.

(56) References Cited

U.S. PATENT DOCUMENTS 5,100,478 A  *  3/1992  Kawabata ..................... 136/249
2002/0104562 A1    8/2002  Emoto et al.
(Continued)

FOREIGN PATENT DOCUMENTS

JP    10-313128    11/1998
JP    2000-12517    1/2000
(Continued)

OTHER PUBLICATIONS

Hylton, et al "Alkaline Etching for Reflectance Reduction in Multicrystalline Silicon Solar Cells" Journal of the Electrochemical Society, 2004, p. G408-G427.*
(Continued)

*Primary Examiner* — Marla D McConnell
(74) *Attorney, Agent, or Firm* — Wenderoth, Lind & Ponack L.L.P.

(57) ABSTRACT

The present invention addresses the problem of providing a novel silicon substrate having a textured surface by dry-etching the surface of a silicon substrate having (111) orientation and thereby forming a texture thereon. The present invention provides a silicon substrate having (111) orientation, said silicon substrate having a textured surface that includes multiple protrusions which each comprise three slant faces and have heights of 100 to 8000 nm. This process for producing a silicon substrate includes: a step of preparing a silicon substrate having (111) orientation; and a step of blowing an etching gas onto the surface of the silicon substrate, said etching gas containing one or more gases selected from the group consisting of ClF3, XeF2, BrF3, BrF5 and NF3.

11 Claims, 9 Drawing Sheets

(56) References Cited

U.S. PATENT DOCUMENTS

| | | |
|---|---|---|
| 2005/0126627 A1 | 6/2005 | Hayashida |
| 2009/0280597 A1 | 11/2009 | Wijekoon et al. |
| 2010/0193027 A1 | 8/2010 | Ji et al. |
| 2011/0272625 A1 | 11/2011 | Wijekoon et al. |

FOREIGN PATENT DOCUMENTS

| | | |
|---|---|---|
| JP | 2000-150937 | 5/2000 |
| JP | 2000-266697 | 9/2000 |
| JP | 2002-164555 | 6/2002 |
| JP | 2002-314110 | 10/2002 |
| JP | 2005-150614 | 6/2005 |
| JP | 2008-124413 | 5/2008 |
| JP | 2008-172279 | 7/2008 |
| JP | 2011-515872 | 5/2011 |

OTHER PUBLICATIONS

International Search Report of PCT Application No. PCT/JP2012/002156 dated May 1, 2012.

* cited by examiner

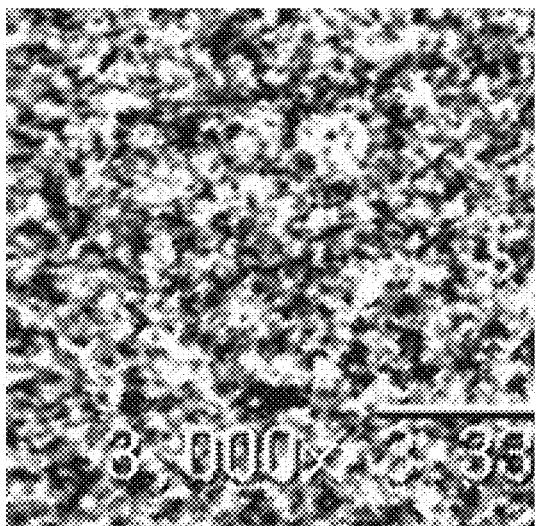 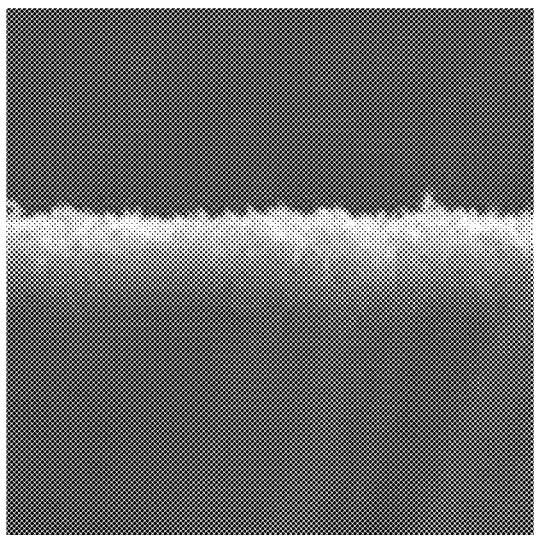
FIG. 8A  FIG. 8B
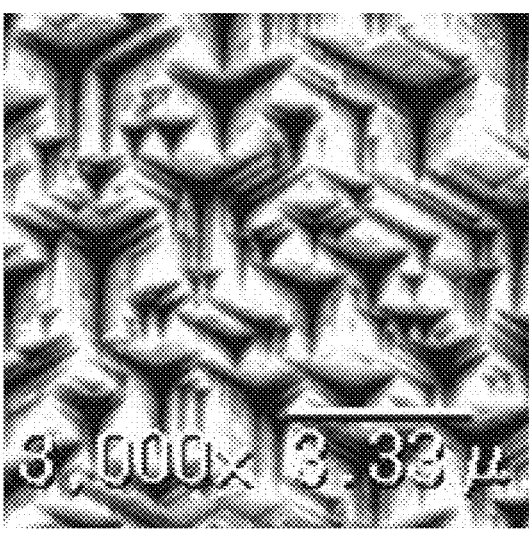 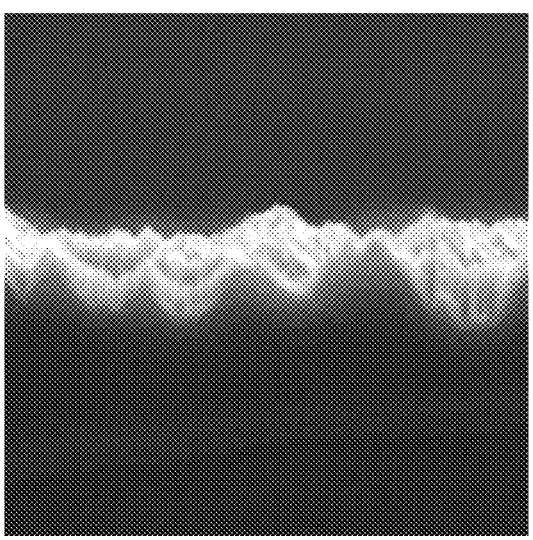
FIG. 8C  FIG. 8D

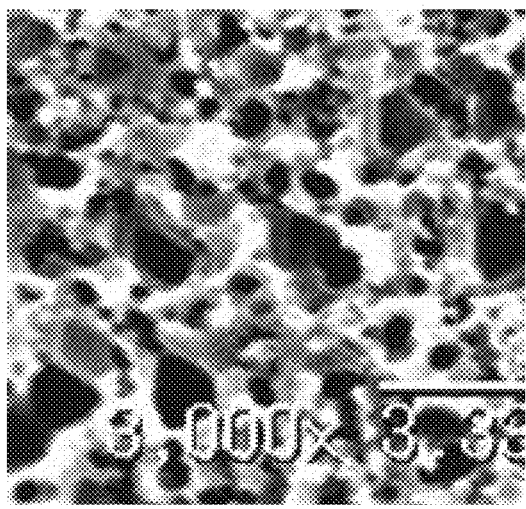
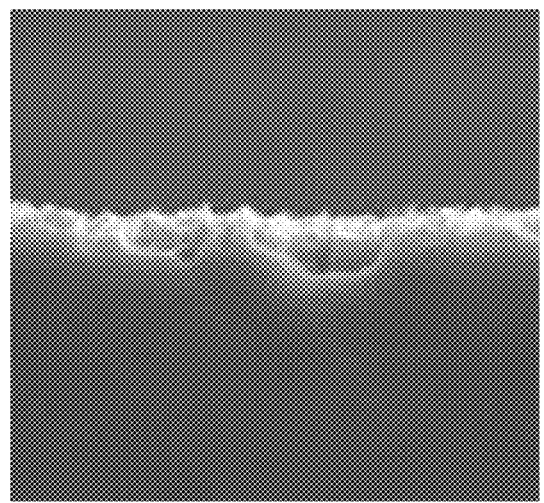
FIG. 9A
FIG. 9B
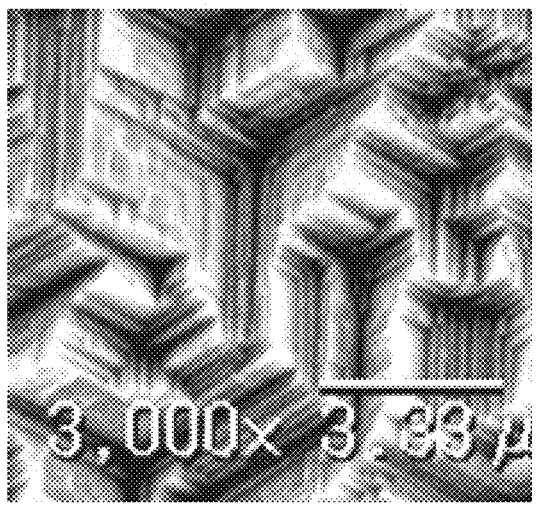
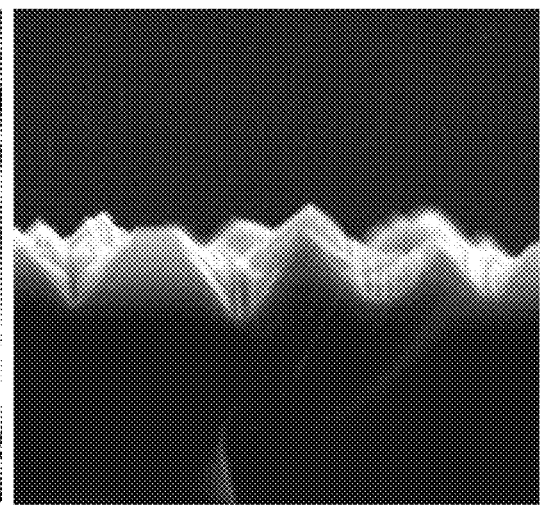
FIG. 9C
FIG. 9D

SILICON SUBSTRATE HAVING TEXTURED SURFACE, AND PROCESS FOR PRODUCING SAME

TECHNICAL FIELD

The present invention relates to a silicon substrate having a textured surface and a manufacturing method thereof.

BACKGROUND ART

In a silicon solar cell (photovoltaic device), unevenness referred to as a texture is provided on a light-receiving surface of a silicon substrate so as to prevent reflection of incident light and leakage of light trapped on the silicon substrate. A surface of a silicon substrate is usually textured by a wet process using an alkaline (KOH) solution as an etchant (see PTL 1, PTL 2, PTL 3, and PTL 4). The texturing by a wet process requires post-processes such as a cleaning process using hydrogen fluoride and a thermal process. Not only may the post-processes contaminate a surface of a silicon substrate, but they also have a disadvantage with regard to increased cost.

In addition, the wet process only allows texturing a silicon substrate having orientation (100) (see PTL 5, for example), and the wet process cannot form a texture on a surface of a silicon substrate having another orientation.

Techniques for forming a texture on a surface of a silicon substrate by a dry process have also been proposed. For example, 1) a technique using reactive ion etching by plasma (see PTL 6 and PTL 7), 2) a technique for etching by a photo-electrolysis reaction (PTL 8), and 3) a technique for etching a surface of a silicon substrate by introducing $ClF_3$ gas and others into a reaction chamber in which the silicon substrate is placed (see PTL 9, PTL 10, and PTL 11) have been proposed.

CITATION LIST

Patent Literature

PTL 1: Japanese Unexamined Patent Application Publication (Translation of PCT Application) No. 2011-515872
PTL 2: Japanese Patent Application Laid-Open No. 2008-172279
PTL 3: United States Patent Application Publication No. 2009/0280597
PTL 4: United States Patent Application Publication No. 2010/0193027
PTL 5: Japanese Patent Application Laid-Open No. 2000-150937
PTL 6: Japanese Patent Application Laid-Open No. 2002-164555
PTL 7: Japanese Patent Application Laid-Open No. 2000-12517
PTL 8: United States Patent Application Publication No. 2002/0104562
PTL 9: Japanese Patent Application Laid-Open No. 10-313128
PTL 10: Japanese Patent Application Laid-Open No. 2005-150614
PTL 11: United States Patent Application Publication No. 2005/0126627

SUMMARY OF INVENTION

Technical Problem

As described above, by a wet process, a texture can only be formed on a silicon substrate having orientation (100). Accordingly, forming a texture on a silicon substrate having another orientation would result in an unconventional unique texture.

For example, the texture formed by a wet process has projections with the height of 10 to 20 μm. The thickness of the entire silicon substrate is naturally greater than the thickness of the projections. As a result, the thickness of the silicon substrate ends up being greater than the thickness required for a silicon substrate used for a solar cell. In contrast, forming a finer texture can reduce the thickness of the entire silicon substrate, increasing material efficiency of silicon.

As described above, a method for forming a texture on a surface of a silicon substrate by a dry process has been proposed. However, with this method, a desired structure of texture may not be achieved. One reason is that a gas such as $ClF_3$, $XeF_2$, $BrF_3$ and $BrF_5$ causes a reaction generating heat with a silicon substrate, increasing the temperature of the silicon substrate. Consequently, anisotropic etching may not be performed. Furthermore, since the composition of the etching gas is not optimized either, it was difficult to achieve a proper texture.

In view of the problems, it is an object of the present invention to provide a silicon substrate having a new textured surface by forming a texture on a surface of a silicon substrate having orientation (111) preferably by dry etching. It is another object of the present invention to provide a solar cell including the silicon substrate.

Solution to Problem

The present invention relates to a silicon substrate having a textured surface and a solar cell including the silicon substrate described as follows.

[1] A silicon substrate having orientation (111) and a textured surface on which a textured structure is formed, in which the textured surface has a plurality of projections each having three slant faces, and a height of the projections is in a range from 100 nm to 8 μm.

[2] The silicon substrate according to [1], in which the height of the projections is in a range from 100 nm to 5 μm.

[3] The silicon substrate according to [1] or [2], in which a side of a bottom surface of each of the projections has a length in a range from 100 nm to 8 μm.

[4] The silicon substrate according to any one of [1] to [3], in which a density of the projections on the textured surface is 10 to 1,000/100 μm$^2$.

[5] The silicon substrate according to any one of [1] to [4], in which an absorbance of incident light having a wavelength of 0.5 μm to 10 μm on the textured surface of the silicon substrate is 80% or higher.

[6] A solar cell including the silicon substrate according to any one of [1] to [5], in which the textured surface is used as a light-receiving surface of the solar cell.

The present invention also relates to a method for manufacturing a silicon substrate having a textured surface described as follows.

[7] A method for manufacturing the silicon substrate according to [1], the method including: providing a silicon substrate having orientation (111); and blowing an etching gas on a surface of the silicon substrate, in which the etching gas contains (i) at least one gas selected from the group consisting of $ClF_3$, $XeF_2$, $BrF_3$, $BrF_5$, and $NF_3$, and (ii) a gas containing an oxygen atom in a molecule thereof.

[8] The method according to [7], in which the etching gas further contains an inert gas.

[9] The method according to [7] or [8], in which a temperature of the silicon substrate is maintained at a temperature of 200° C. or lower.

[10] The method according to any one of [7] to [9], in which etching on the silicon substrate is performed under a reduced-pressure environment.

Advantageous Effects of Invention

The silicon substrate according to the present invention has a textured surface with a low reflectance. Accordingly, by setting the textured surface as a light-receiving surface, the silicon substrate can be suitably used as a silicon substrate for a solar cell. Furthermore, since the texture according to the present invention is a fine-structure, it is possible to reduce the thickness of the silicon substrate, increasing the material efficiency of the silicon substrate, which will increase flexibility in designing a device.

BRIEF DESCRIPTION OF DRAWINGS

FIGS. 8A to 8D show textured surfaces of a silicon substrate obtained in Example 2; and FIGS. 9A to 9D show textured surfaces of a silicon substrate obtained in Example 3.

DESCRIPTION OF EMBODIMENTS

1. Silicon Substrate Having Textured Surface

A silicon substrate according to the present invention has a feature in a textured surface on the substrate. The textured surface refers to a surface of the substrate having the textured structure.

It is preferable that the silicon substrate is made of single-crystal silicon; the silicon substrate may be doped with a p-type impurity or an n-type impurity, or may be intrinsic silicon. The silicon substrate has orientation (111). A silicon substrate having orientation other than (111) is not likely to have the textured surface according to the present invention.

One feature of the silicon substrate having the textured surface according to the present invention is that the orientation of the silicon substrate is (111). Conventional wet etching allows a silicon substrate with orientation (100) to have a textured surface. However, the conventional wet etching can not form the textured surface on the silicon substrate having the orientation (111), and such a substrate is isotropically etched instead.

The textured surface refers to a surface having a low reflectance. A low reflectance surface is a surface preferably having a reflectance of approximately 20% or less, more preferably 10% or less, and refers to a surface having a reflectance of substantially 0%, when a reflectance of a mirror surface for light having a wavelength from 0.5 to 1.0 µm is set as 100%. The silicon substrate having the textured surface according to the present invention preferably has an absorbance (a wavelength range of 0.5 to 1.0 µm) of 80% or higher, and more preferably 85% or higher. The absorbance can be measured by a sphere spectrophotometer, and can be calculated by the following equation: absorbance(%)=100×{intensity of incident light−(intensity of reflected light+intensity of transmitted light)}/intensity of incident light.

Figure 4:
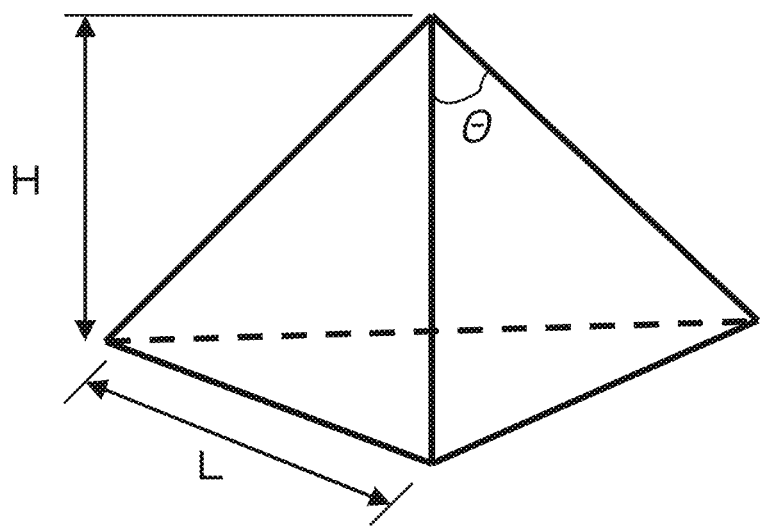
FIG. 4 schematically illustrates a projection having three slant faces.

More specifically, the textured surface according to the present invention has projections each having three slant faces (see the schematic diagram in FIG. 4 for details). The projection having the three slant faces may be a projection having the shape of a triangular pyramid. It is preferable that the textured surface has the projections with three slant faces closely formed with each other. Each of the three slant faces has orientation (110), (101), or (011), which is different from orientation (111). It is preferable that the projection has an apex.

The height H of the projection having three slant faces (see FIG. 4) is usually 100 nm to 8 µm, preferably 100 nm to 3 µm, more preferably 100 nm to 1.5 µm, and even more preferably 100 nm to 1 µm. In addition, the length L of a side of the bottom surface of the projection having three slant faces (see FIG. 4) is usually 100 nm to 8 µm, preferably 100 nm to 3 µm, more preferably 100 nm to 1.5 µm, and even more preferably 100 nm to 1 µm.

The angle θ of the apex of the projection having three slant faces (see FIG. 4) is preferably 54.7°±10°.

A feature of the silicon substrate having the textured surface according to the present invention is that the projections composing the texture are small. Projections in the textured structure formed by the conventional wet etching or ion plasma etching are much higher (for example, the height of a textured structure formed by wet etching is from 10 to 20 µm), and it was not possible to form miniaturized projections as in the present invention. The more miniaturized the structure of the texture, the more suppressed reflection of light on the textured surface. For example, if the processing accuracy of the textured surface is 1 µm or less, the reflection of light having the wavelength of 1 µm is set to be nearly zero.

Another feature of the silicon substrate having the textured surface according to the present invention is that the thickness of the silicon substrate can be reduced. More specifically, since the projections composing the textured structure are miniaturized, the thickness of the silicon substrate can be reduced as much as the reduced thickness of the projections. The thickness of the silicon substrate according to the present invention is 20 µm or less including the height of the projections, preferably 15 µm or less, and even more preferably 10 µm or less. The lower limit on the thickness of the silicon substrate is not particularly set as long as a sufficient strength as a substrate is maintained, and is usually 10 µm or more.

The textured surface has a plurality of projections having three slant faces, and the projections having three slant faces may each have a different shape. A preferable density of the projections on the textured surface is 10 to 1,000 per unit area (100 µm²).

The surface of the silicon substrate may be entirely textured; alternatively, the silicon substrate may be partially textured. For example, when the silicon substrate according to the present invention is used as a silicon substrate for a solar cell, it is preferable that an area for a front surface electrode (including a connector electrode, a bar electrode, a grid electrode and others) provided on the light-receiving surface side preferably remains flat, without the textured structure.

2. Method for Manufacturing Silicon Substrate Having Textured Surface

The method for manufacturing the silicon substrate according to the present invention includes: providing a silicon substrate having orientation (111), and blowing an etching gas on the silicon substrate. Preferably, the manufacturing method further includes blowing a cooling gas on the silicon substrate, and blowing the etching gas and the cooling gas may be alternately repeated.

The silicon substrate having the orientation (111) is a single-crystal silicon substrate having a main surface with orientation (111). The silicon substrate may be a semiconductor wafer, or a semiconductor layer stacked on another substrate. In any case, the textured structure is formed on the surface having orientation (111), which is the orientation of the main surface.

The silicon substrate provided may be made of intrinsic silicon, or silicon doped with a p-type or n-type impurity. A silicon substrate doped with a p-type impurity is usually provided for a silicon substrate for a solar cell.

The etching gas is blown on the silicon substrate under a condition in which the pressure is in a range from the atmospheric pressure to 80 KPa. The pressure is preferably 30 KPa or lower, more preferably 20 KPa or lower, and even more preferably 10 KPa or lower, and may be 50 Pa or lower. The lower the pressure at the time of etching is, the finer the structure becomes; however, a higher pressure is likely to provide a smaller structure of texture.

The etching gas includes at least one of $ClF_3$, $XeF_2$, $BrF_3$, $BrF_5$, and $NF_3$ (may be referred to as a "fluorine-containing gas"). The fluorine-containing gas included in the etching gas may be a mixed gas of two or more of the fluorine-containing gases described above.

Molecules of the fluorine-containing gas are physisorbed on the surface of the silicon substrate, and migrate to an etching site. The molecules of the gas reached the etching site are decomposed, and a volatile fluoride is generated by a reaction with silicon. With this process, the surface of the silicon substrate is etched, forming a textured surface.

It is preferable that the etching gas includes an inert gas, in addition to the fluorine-containing gas. The inert gas is nitrogen, argon, or helium gas, for example, and may be any gas that does not react with silicon. The inert gas included in the etching gas may be a mixed gas of two or more types of gases.

The total concentration (volume concentration) of the inert gas in the etching gas is preferably three time or more than the total concentration of the fluorine-containing gas, and may be 10 times or more, or 20 times or more. The higher the total concentration of the fluorine-containing gas in the etching gas, the more likely the size of projections each having three slant faces increases (the height of the projections increases). Accordingly, in order to reduce the size of the projections, it is preferable to increase the concentration of the inert gas and to reduce the concentration of the fluorine-containing gas relative to the inert gas (see the following Examples 1 and 2).

If the concentration of the inert gas in the etching gas is low and the concentration of the fluorine-containing gas is relatively high, the surface of the silicon substrate may be etched isotropically, which makes it difficult to form a desired textured structure on the surface of the silicon substrate.

Furthermore, it is preferable that the etching gas includes a gas containing an oxygen atom in its molecule, in addition to the fluorine-containing gas. The gas containing oxygen atoms is typically oxygen gas ($O_2$); however, may be carbon dioxide ($CO_2$) or nitrogen dioxide ($NO_2$).

The concentration of the gas containing oxygen atoms (volume concentration, at ordinary temperature) is preferably more than twice the total concentration of the fluorine-containing gas, and more preferably four times or more. The concentration of the gas containing oxygen atoms in the etching gas (volume concentration, at ordinary temperature) is preferably 30 to 80% of the total concentration of the fluorine-containing gas and the inert gas. When the concentration of the gas containing oxygen atoms in the etching gas is too low, the desired texture may not be achieved due to over-etching.

By including the gas containing oxygen atoms in the etching gas, unevenness suitable for the textured structure in a solar cell may be formed on a surface of a semiconductor substrate. Although the mechanism is not particularly limited, when $ClF_3$ gas is physisorbed on the surface of silicon, $ClF_3$ reacts with the silicon, and $SiF_4$ is generated, which is gas. Here, by oxygen atoms terminating dangling bonds in a silicon network structure, Si—O bond is partially formed. As a result, a portion likely to be etched (Si—Si) and a portion unlikely to be etched (Si—O) are produced. It is assumed that the difference in the etching rates promotes chemical reactions, allowing controlling the shape of the structure.

Figure 7A:
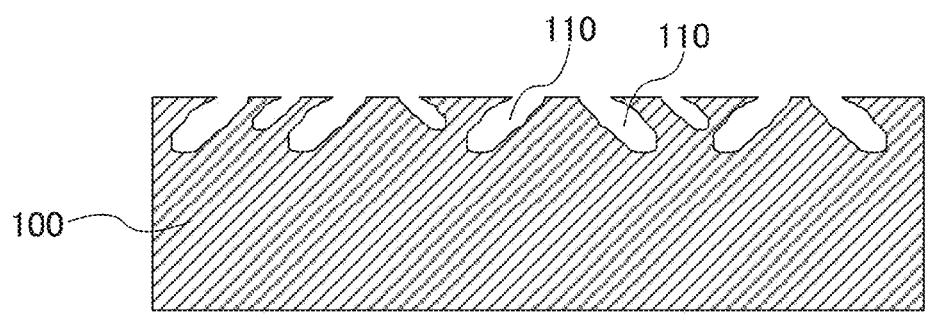
FIGS. 7A to 7C show an assumption on reaction mechanism by which a textured structure is formed.
Figure 7B:
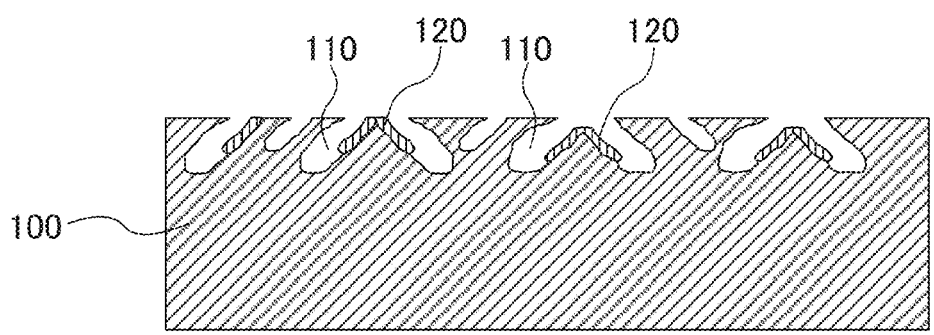
Figure 7C:
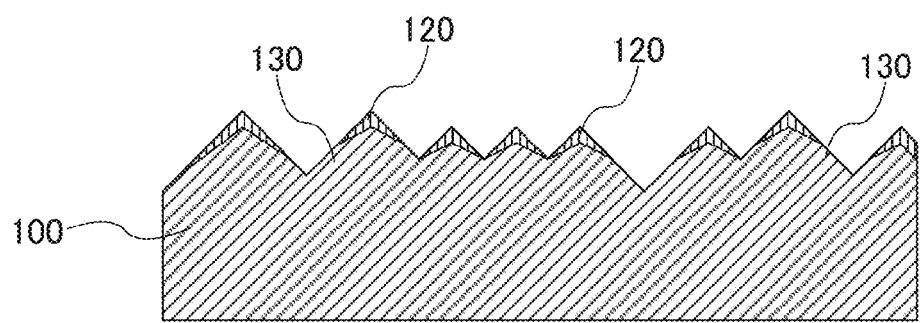

FIGS. 7A to 7C show an assumption on the mechanism of reactions when the textured structure on the surface of the semiconductor substrate is formed; however, the mechanism for forming the textured structure is not limited to this example. In an early stage of the textured structure formation (FIG. 7A), the etching reaction on silicon substrate 100 by the fluorine-containing gas ($ClF_3$) preferentially proceeds, and pores 110 are formed on the surface of silicon substrate 100, making the surface into a porous structure. In an intermediate stage (FIG. 7B), the surface of porous silicon substrate 100 is oxidized by the oxygen-containing gas along the orientation of the surface, and oxidized layer 120 is formed. In a later stage (FIG. 7C), oxidized layer 120 serves as an etching mask, forming desired projections 130 (projections each having three slant faces).

In the method for manufacturing the silicon substrate according to the present invention, it is important to maintain the temperature of the silicon substrate at a low temperature during etching. It is preferable to maintain the temperature of the silicon substrate at 200° C. or lower, more preferably 180° C. or lower, and even more preferably 160° C. or lower. In order to maintain the temperature of the silicon substrate at a low temperature, it is preferable to maintain the temperature of a stage for placing the silicon substrate approximately at room temperature (25° C.) or lower. The temperature of the silicon substrate during etching may be measured by an infrared temperature sensor or by providing a thermocouple.

As described above, the method for manufacturing the silicon substrate according to the present invention may include blowing the cooling gas on the silicon substrate. The cooling gas is similar to the inert gas described above, and refers to nitrogen, argon, helium, or other gases. By blowing the cooling gas on the silicon substrate generating heat by the reaction with the etching gas, the heated substrate is cooled.

In the method for manufacturing the silicon substrate according to the present invention, blowing the etching gas on the silicon substrate and blowing the cooling gas on the silicon substrate may be alternately repeated. By controlling the processing time for blowing the etching gas on the silicon substrate, the temperature of the substrate is maintained at a low temperature. Although the processing time is not particularly limited, the processing time may be approximately 1 minute to 10 minutes. After the etching gas is blown on the silicon substrate, the temperature of the substrate is decreased by blowing the cooling gas, and then the etching gas may be blown on the silicon substrate.

When the desired textured structure is formed on the surface of the silicon substrate by the etching gas, it is preferable to remove the etching gas or a degradation product of the etching gas remaining on the silicon substrate. For example, the remaining fluorine component on the silicon substrate may be removed in a hydrogen gas atmosphere.

In the method for manufacturing the silicon substrate according to the present invention, the blowing of the etching gas on the silicon substrate may be performed in two steps. More specifically, in the first step, processing using a fluorine-containing gas that does not contain gas containing oxygen atoms and an inert gas is performed, and a roughened surface as shown in FIG. 2A, 2B, 3A or 3B, for example, is formed on the silicon substrate. In the second step, a chemical reaction is promoted by the difference in the etching rates generated through the process using the gas containing oxygen atoms, allowing controlling the shape of the surface of the substrate.

3. Use of Silicon Substrate Having Textured Surface

As described above, the silicon substrate according to the present invention is preferably used as a silicon substrate for a solar cell. For adapting the silicon substrate to a solar cell, a p-n junction is preferably provided by forming an emitter layer on the textured surface of the silicon substrate. For example, when the textured surface is formed on a p-type silicon substrate, the textured surface is heated under a phosphorus oxychloride atmosphere, and an n-type emitter layer is formed on the textured surface so as to form a p-n junction. Stacking an anti-reflective layer on the emitter layer further reduces reflectance of the solar cell, improving a photoelectric conversion rate. The anti-reflective layer may be a silicon nitride layer, a silicon oxide layer, or a titanium oxide layer, for example.

Subsequently, a front electrode is provided on a light-receiving surface which is the textured surface, and a back electrode is provided on the non-light-receiving surface, and thus a solar cell is implemented. Needless to say, an embodiment of the solar cell is not limited to the example described above.

EXAMPLES

Example 1

Figure 5A:
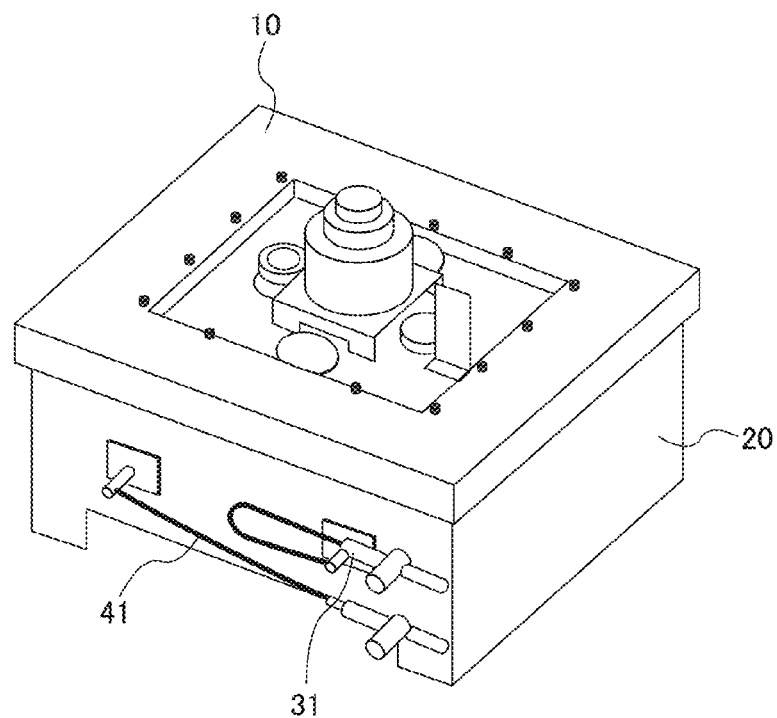
FIGS. 5A and 5B illustrate an overview of a texturing apparatus used in Examples.
Figure 5B:
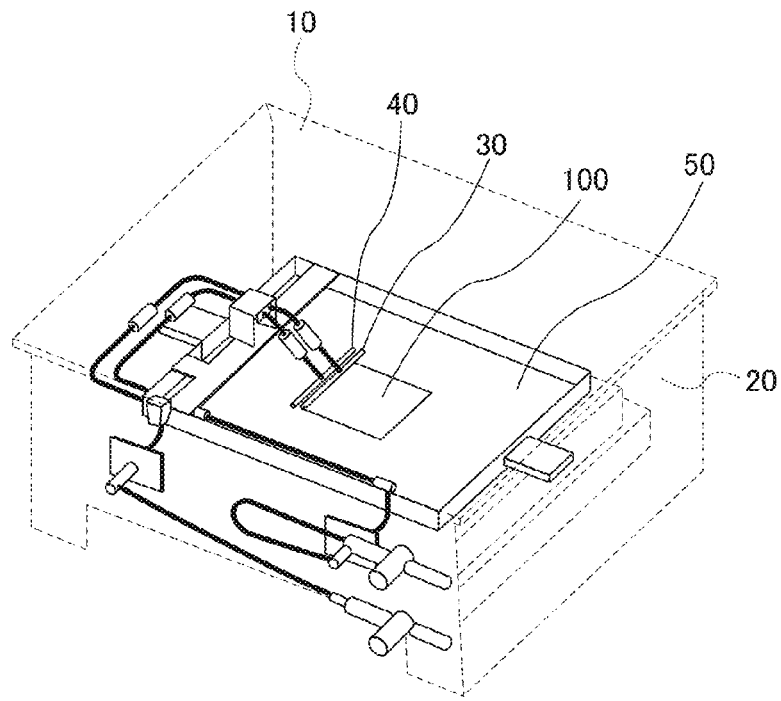

FIGS. 5A and 5B illustrate an overview of a texturing apparatus used in Examples. FIG. 5A is an external perspective view of texturing apparatus 10, and FIG. 5B is a perspective view seeing through reduced-pressure chamber 20. Texturizing apparatus 10 illustrated in FIGS. 5A and 5B includes, in reduced-pressure chamber 20, nozzle 30 for blowing an etching gas, nozzle 40 for blowing a cooling gas, and stage 50 for placing silicon substrate 100. Nozzle 30 for blowing the etching gas is connected to etching gas supply pipe 31, and nozzle 40 for blowing the cooling gas is connected to cooling gas supply pipe 41. A silicon substrate having a textured surface is manufactured by blowing the etching gas and the cooling gas on silicon substrate 100 placed on stage 50.

Silicon substrate 100 having orientation (111) is placed on stage 50 of texturing apparatus 10 illustrated in FIGS. 5A and 5B. The distance between nozzle 30 that blows the etching gas and silicon substrate 100 is set to be 5 mm The area of the surface of silicon substrate 100 is 125 mm×125 mm The temperature of stage 50 is set to 25° C. After the pressure of reduced-pressure chamber 20 is adjusted to 90 KPa, the etching gas through nozzle 30 is blown on the entire surface of silicon substrate 100 for 10 to 60 seconds. The composition of the etching gas blown is "$ClF_3/O_2/N_2$=500 to 1,000 cc/0 cc/2,000 to 10,000 cc".

Next, an etching gas through nozzle 30 having a different composition is blown on the entire surface of silicon substrate 100 for 60 to 120 seconds. The composition of the etching gas blown is "$ClF_3/O_2/N_2$=500 to 1,000 cc/500 to 5,000 cc/2,000 to 10,000 cc".

Figure 1A:
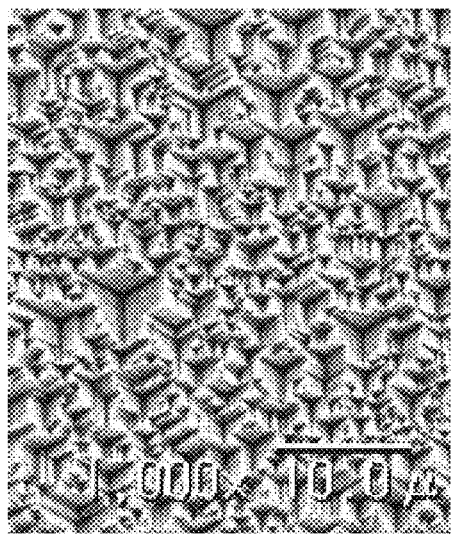
FIGS. 1A to 1F are electron micrographs of a textured surface on a silicon substrate according to Examples.
Figure 1D:
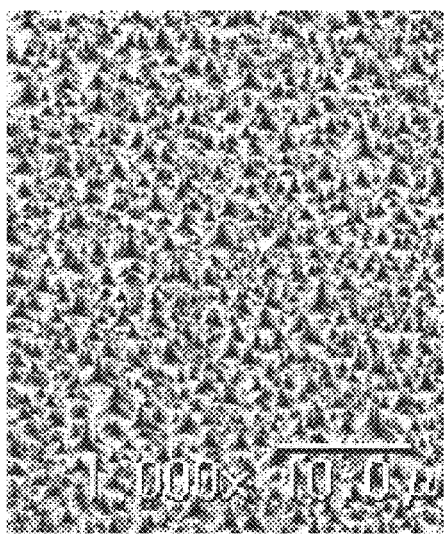
Figure 1B:
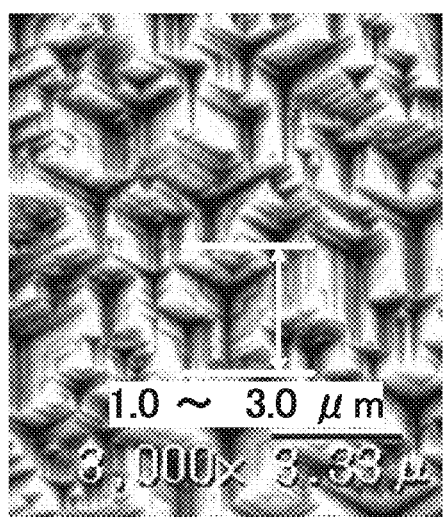
Figure 1E:
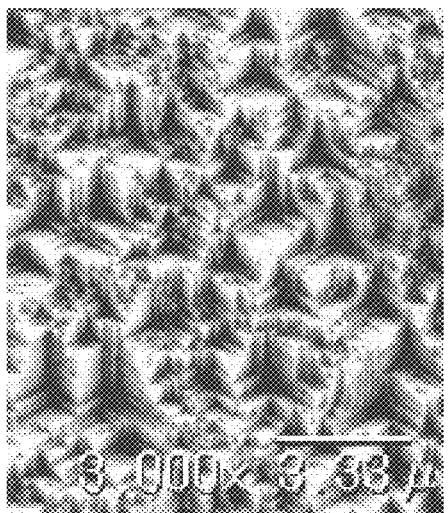
Figure 1C:
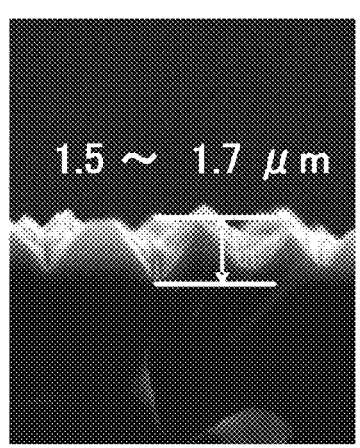
Figure 1F:
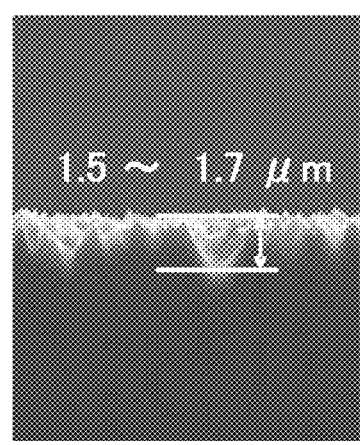

FIGS. 1A to 1D show electron micrographs of the textured surface of the silicon substrate obtained. As shown in FIG. 1A (1,000×) and FIG. 1B (3,000×), or FIG. 1D (1,000×) and FIG. 1E (3,000×), projections each having three slant faces are closely formed. Note that, FIG. 1B is an enlarged view of FIG. 1A, and FIG. 1E is an enlarged view of FIG. 1D. As shown in FIG. 1C and FIG. 1F (3000×), the height of the projection having three slant faces is approximately 1.6 μm (represented as 1.5 μm to 1.7 μm in the drawings). Note that, FIG. 1A is a perspective view of an electron micrograph of the periphery of the silicon substrate surface having the texture, and FIG. 1D is a perspective view of an electron micrograph of a central part of the silicon substrate surface.

Comparative Example 1

Silicon substrate 100 having orientation (111) is placed on stage 50 of texturing apparatus 10 illustrated in FIGS. 5A and 5B. The area of the surface of silicon substrate 100 is 125 mm×125 mm. The temperature of stage 50 is set to 80° C. After the pressure of reduced-pressure chamber 20 is adjusted to 90 KPa, the etching gas through nozzle 30 is blown on the entire surface of silicon substrate 100 for 75 to 180 seconds. The composition of the etching gas blown is "$ClF_3/O_2/N_2$=500 to 1,000 cc/0 cc/2,000 to 5,000 cc".

Figure 2A:
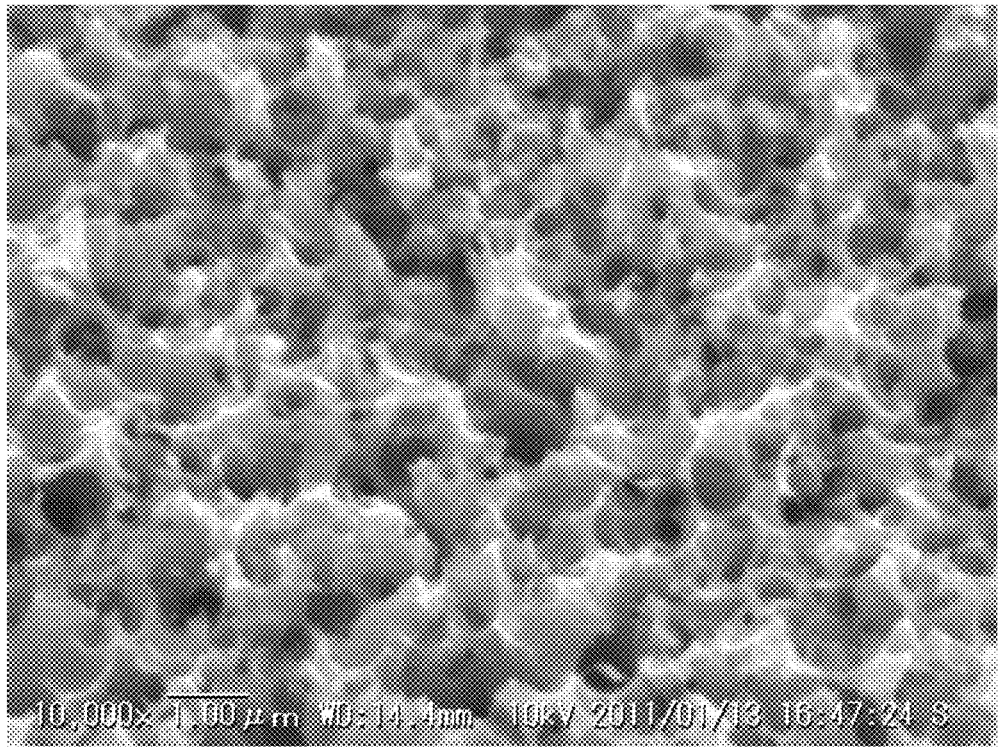
FIGS. 2A and 2B show an example in which a desired textured surface is not formed by dry-etching on a silicon substrate.
Figure 2B:
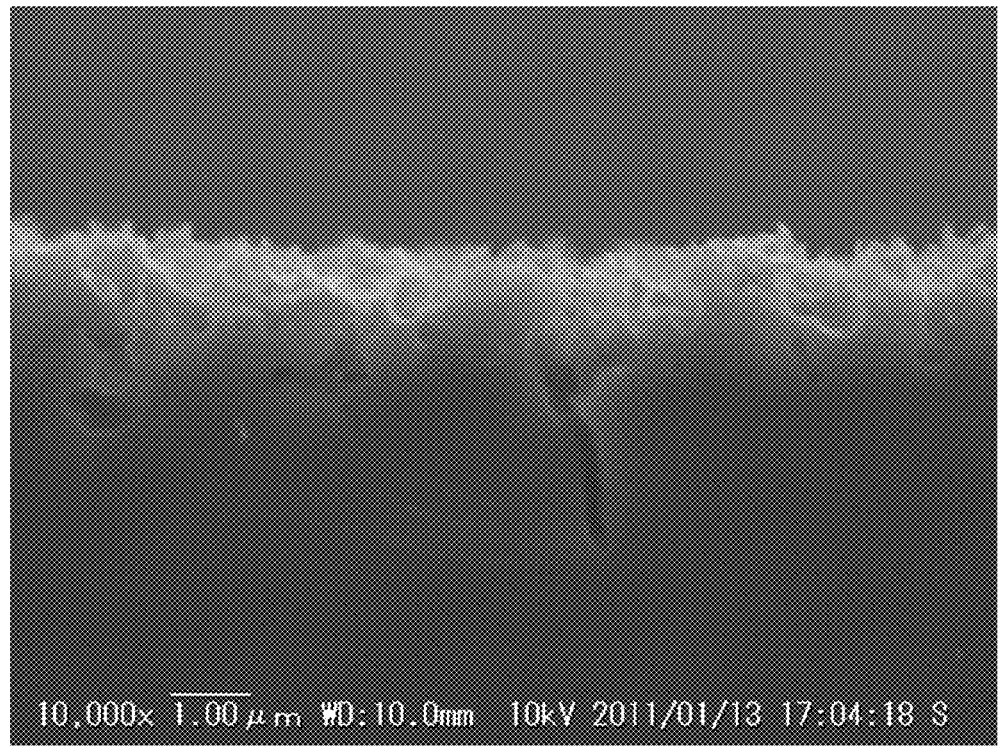

FIGS. 2A and 2B show the shape of surface of the silicon substrate obtained. As shown in FIG. 2A (top view, 10,000×) and FIG. 2B (cross-sectional view, 10,000×), although the surface of the silicon substrate is roughened, the shape is irregular, and no projection having three slant faces is formed. This is because the temperature of the silicon substrate is not maintained at a low temperature.

Comparative Example 2

Silicon substrate 100 having orientation (111) is placed on stage 50 of texturing apparatus 10 illustrated in FIGS. 5A and 5B. The area of the surface of silicon substrate 100 is 125 mm×125 mm. The temperature of stage 50 is set to 25° C. After the pressure of reduced-pressure chamber 20 is adjusted to 90 KPa, the etching gas through nozzle 30 is blown on the entire surface of silicon substrate 100 for 75 to 180 seconds. The composition of the etching gas blown is "$ClF_3/O_2/N_2$=500 to 1,000 cc/0 cc/2,000 to 5,000 cc".

Figure 3A:
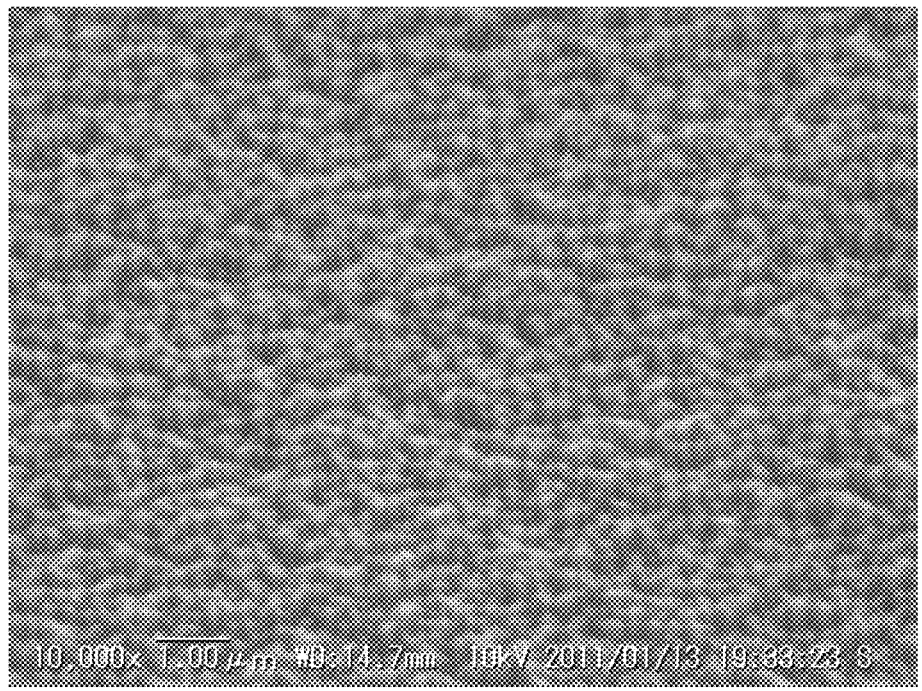
FIGS. 3A and 3B show an example in which a desired textured surface is not formed by dry-etching on a silicon substrate.
Figure 3B:
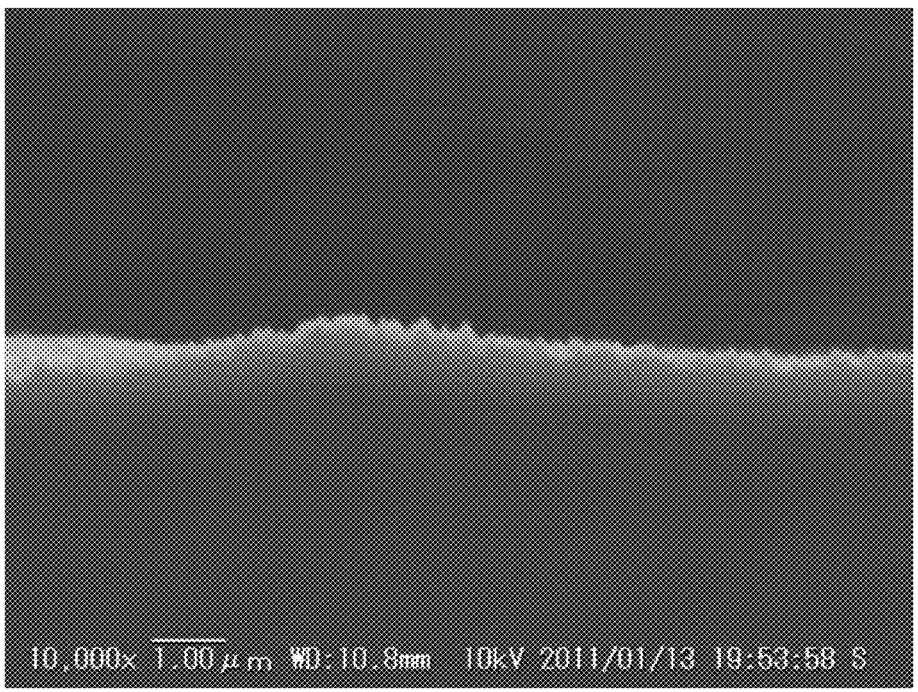

FIGS. 3A and 3B show the shape of the surface of the silicon substrate obtained. As shown in FIG. 3A (top view, 10,000×) and FIG. 3B (cross-sectional view, 10,000×), although the surface of the silicon substrate is finely roughened, no projection having three slant faces is formed.

Example 2

Silicon substrate 100 having orientation (111) is placed on stage 50 of texturing apparatus 10 illustrated in FIGS. 5A and 5B. The area of the surface of silicon substrate 100 is 125 mm×125 mm. The temperature of stage 50 is set to 25° C. After the pressure of reduced-pressure chamber 20 is adjusted to 90 KPa, the etching gas is blown in two steps.

In the first step, the etching gas through nozzle 30 is blown on the entire surface of silicon substrate 100 for 10 to 30 seconds. The composition of the etching gas blown is "$ClF_3/O_2/N_2$=500 to 1,000 cc/0 cc/2,000 to 10,000 cc".

In the second step, the etching gas through nozzle 30 is blown on the entire surface of the silicon substrate 100 for 60 to 120 seconds. The composition of the etching gas blown is "$ClF_3/O_2/N_2$=500 to 1,000 cc/500 to 5,000 cc/2,000 to 10,000 cc".

FIGS. 8A to 8D (electron micrograph, 3000×) show the shape of the surface of the silicon substrate obtained. FIGS. 8A and 8B show the shape of the surface of the silicon substrate after the first step is complete. As shown in FIG. 8A (top view) and FIG. 8B (cross-sectional view), although the surface of the silicon substrate is finely roughened, no projection having three slant faces is formed.

FIGS. 8C and 8D show the shape of the surface of the silicon substrate after the second step is complete. As shown in FIG. 8C (top view) and FIG. 8D (cross-sectional view), projections each having three slant faces and a height of 1.0 μm to 3.0 μm are closely formed on the surface of the silicon substrate.

Example 3

Silicon substrate 100 having orientation (111) is placed on stage 50 of texturing apparatus 10 illustrated in FIGS. 5A and 5B. The area of the surface of silicon substrate 100 is 125 mm×125 mm. The temperature of stage 50 is set to 25° C. After the pressure of reduced-pressure chamber 20 is adjusted to 90 KPa, the etching gas is blown in two steps.

In the first step, the etching gas through nozzle 30 is blown on the entire surface of silicon substrate 100 for 40 to 60 seconds. The composition of the etching gas blown is "$ClF_3/O_2/N_2$=500 to 1,000 cc/0 cc/2,000 to 10,000 cc". In the second step, the etching gas from nozzle 30 is blown on the entire surface of silicon substrate 100 for 60 to 120 seconds. The composition of the etching gas blown is "$ClF_3/O_2/N_2$=500 to 1,000 cc/500 to 5,000 cc/2,000 to 10,000 cc".

FIGS. 9A to 9D (electron micrograph, 3,000×) show the shape of surface of the silicon substrate obtained. FIGS. 9A and 9B show the shape of the surface of the silicon substrate after the first step is complete. As shown in FIG. 9A (top view) and FIG. 9B (cross-sectional view), although the surface of the silicon substrate is finely roughened, no projection having three slant faces is formed. In addition, the surface of the silicon substrate after the first step in Example 3 is rougher than the surface of the silicon substrate after the first step in Example 2 (see FIGS. 8A and 8B).

FIGS. 9C and 9D show the shape of the surface of the silicon substrate after the second step is complete. As shown in FIG. 9C (top view) and FIG. 9D (cross-sectional view), projections each having three slant faces and a height of 1.0 μm to 6.0 μm are closely formed on the surface of the silicon substrate. The height of the projections formed on the surface of the silicon substrate after the second step in Example 3 is greater than the height of the projections formed on the surface of the silicon substrate after the second step in Example 2 (see FIGS. 8C and 8D).

The reflectance and the absorbance of the silicon substrate on the textured surface obtained in Example 1 are measured. As Reference Example, the reflectance and absorbance of a non-textured surface of the silicon substrate having orientation (111) are measured. The reflectance and absorbance are measured by a sphere spectrophotometer (U4000, manufactured by Hitachi High-Tech Fielding Corporation).

Figure 6A:
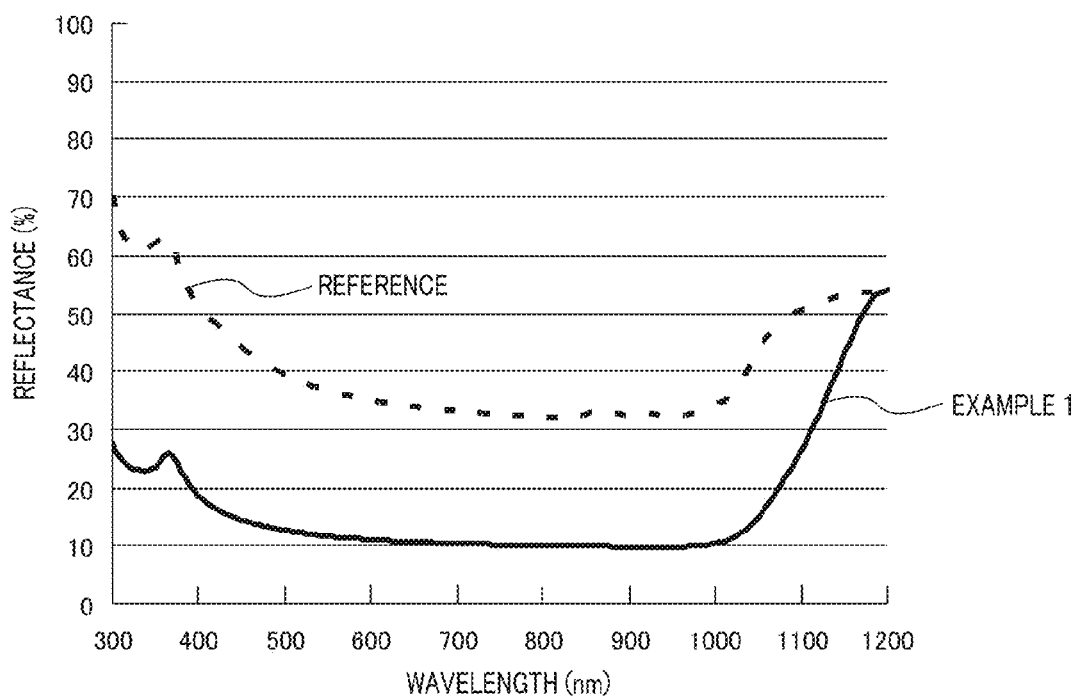
FIG. 6A is a graph representing reflectance of a non-textured surface on a silicon substrate having orientation (111) (Reference Example) and a textured surface on a silicon substrate obtained in Example.
Figure 6B:
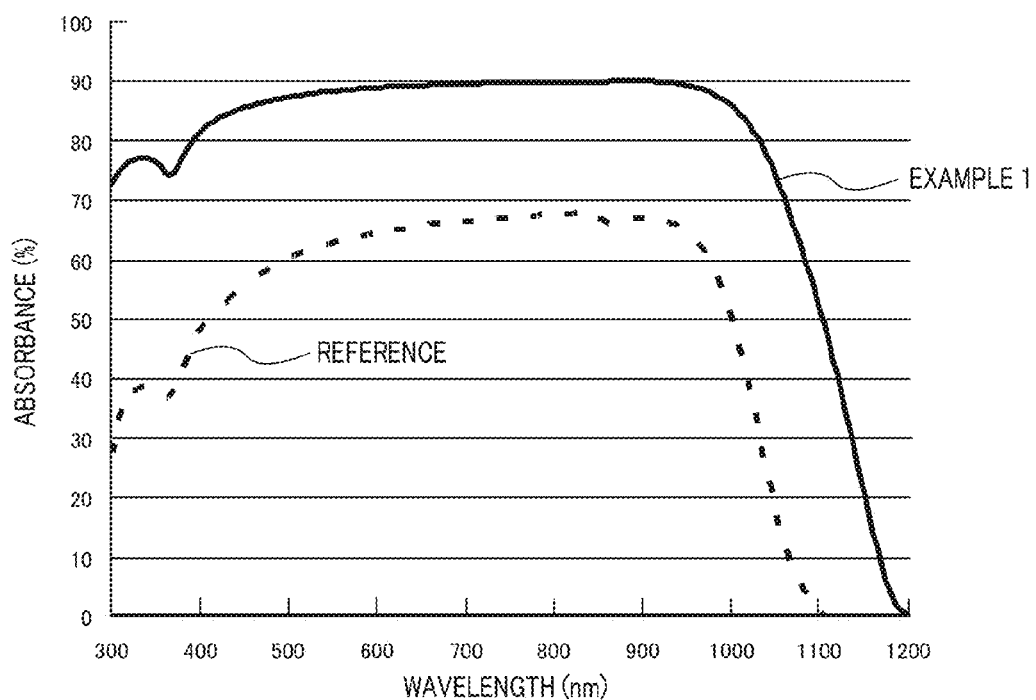
FIG. 6B is a graph representing absorbance of a non-textured surface on a silicon substrate having orientation (111) (Reference Example) and a textured surface on a silicon substrate obtained in Example.

FIG. 6A is a graph representing reflectance at the non-textured surface of the silicon substrate having orientation (111) (Reference Example) and on the textured surface of the silicon substrate obtained in Example; and FIG. 6B is a graph representing absorbance on the non-textured surface of the silicon substrate having orientation (111) (Reference Example) and on the textured surface of the silicon substrate obtained in Example.

As illustrated in FIG. 6A and FIG. 6B, the reflectance (wavelength of 500 nm to 1,000 nm) on the textured surface of the silicon substrate according to Example 1 is reduced to 20% or lower, and the absorbance (wavelength of 500 nm to 1,000 nm) is increased to 80% or higher.

Industrial Applicability

The silicon substrate according to the present invention has a textured surface with low reflectance. In addition, the textured surface is more finely formed than in the conventional technique, and the thickness of the silicon substrate may be reduced. Accordingly, by setting the textured surface as the light-receiving surface, the silicon substrate can be suitably used as a silicon substrate for a solar cell. Accordingly, the silicon substrate contributes to an increased photoelectric conversion rate of a solar cell.

REFERENCE SIGNS LIST

10 Texturing apparatus
20 Reduced-pressure chamber
30 Nozzle that blows etching gas
31 Etching gas supply pipe
40 Nozzle that blows cooling gas
41 Cooling gas supply pipe
50 Stage
100 Silicon substrate
110 Pore
120 Oxidized layer
130 Projection

The invention claimed is:

1. A silicon substrate for a solar cell, the silicon substrate having orientation (111) and a textured surface used as a light-receiving surface on which a textured structure is formed,
    wherein the textured surface has a plurality of projections each having three slant faces, and a height of the projections is in a range from 100 nm to 8 μm,
    a silicon oxidized layer is located on each of the projections,
    the plurality of projections include a first projection having a first apex, and a second projection having a second apex,
    the first projection is adjacent to the second projection,
    the silicon oxidized layer includes (i) a first silicon oxidized part in direct contact with the first apex and covering the first apex, and (ii) a second silicon oxidized part in direct contact with the second apex and covering the second apex,
    the silicon oxidized layer does not directly contact a recessed portion of the silicon substrate located between the first apex and the second apex,
    each of the three slant faces has orientation (110), (101), or (011), and the recessed portion of the silicon substrate is located at an intersection of a bottom of the first projection and a bottom of the second projection.

2. The silicon substrate for a solar cell according to claim 1, wherein the height of the projections is in a range from 100 nm to 5 µm.

3. The silicon substrate for a solar cell according to claim 1, wherein a side of a bottom surface of each of the projections has a length in a range from 100 nm to 8 µm.

4. The silicon substrate for a solar cell according to claim 1, wherein a density of the projections on the textured surface is 10 to 1,000 /100µm$^2$.

5. The silicon substrate for a solar cell according to claim 1, wherein an absorbance of incident light having a wavelength of 0.5 µm to 10 µm on the textured surface of the silicon substrate is 80% or higher.

6. The silicon substrate for a solar cell according to claim 1, wherein the projections each having three slant faces are projections each having a shape of a triangular pyramid.

7. A solar cell comprising the silicon substrate for a solar cell according to claim 1, wherein the textured surface is used as a light-receiving surface of the solar cell.

8. A method for manufacturing the silicon substrate for a solar cell according to claim 1, the method comprising:
providing a silicon substrate having orientation (111); and
blowing an etching gas on a surface of the silicon substrate,
wherein the etching gas contains (i) at least one gas selected from the group including: $ClF_3$, $XeF_2$, $BrF_3$, $BrF_5$, and $NF_3$, and (ii) a gas containing an oxygen atom in a molecule thereof.

9. The method according to claim 8, wherein the etching gas further contains an inert gas.

10. The method according to claim 8, wherein a temperature of the silicon substrate is maintained at a temperature of 200° C. or lower.

11. The method according to claim 8, wherein etching on the silicon substrate is performed under a reduced-pressure environment.

* * * * *